(12) United States Patent
Kim et al.

(10) Patent No.: US 12,080,689 B2
(45) Date of Patent: Sep. 3, 2024

(54) DISPLAY DEVICE USING SEMICONDUCTOR LIGHT-EMITTING ELEMENTS AND MANUFACTURING METHOD THEREFOR

(71) Applicant: LG ELECTRONICS INC., Seoul (KR)

(72) Inventors: Dohee Kim, Seoul (KR); Gunho Kim, Seoul (KR); Yongil Shin, Seoul (KR); Bongchu Shim, Seoul (KR); Hyunwoo Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 388 days.

(21) Appl. No.: 17/632,058

(22) PCT Filed: Sep. 3, 2019

(86) PCT No.: PCT/KR2019/011276
§ 371 (c)(1),
(2) Date: Feb. 1, 2022

(87) PCT Pub. No.: WO2021/040110
PCT Pub. Date: Mar. 4, 2021

(65) Prior Publication Data
US 2022/0278082 A1 Sep. 1, 2022

(30) Foreign Application Priority Data
Aug. 23, 2019 (KR) .................. 10-2019-0103773

(51) Int. Cl.
*H01L 25/075* (2006.01)
*H01L 23/00* (2006.01)
*H01L 33/00* (2010.01)

(52) U.S. Cl.
CPC .......... *H01L 25/0753* (2013.01); *H01L 24/83* (2013.01); *H01L 24/95* (2013.01);
(Continued)

(58) Field of Classification Search
None
See application file for complete search history.

(56) References Cited

U.S. PATENT DOCUMENTS

| 10,141,485 B1 * | 11/2018 | Hur ....................... F21S 41/155 |
| 2017/0236811 A1 | 8/2017 | Pokhriyal et al. |
| 2022/0415859 A1 | 12/2022 | Choi et al. |

FOREIGN PATENT DOCUMENTS

| KR | 10-2013-0033450 | 4/2013 |
| KR | 10-2018-0081378 | 7/2018 |

(Continued)

OTHER PUBLICATIONS

European Patent Office Application Serial No. 19943479.6, Search Report dated Sep. 6, 2023, 3 pages.

(Continued)

*Primary Examiner* — Robert K Carpenter
(74) *Attorney, Agent, or Firm* — LEE, HONG, DEGERMAN, KANG & WAIMEY

(57) ABSTRACT

The present invention relates to a display device having a structure in which an assembly substrate on which self-assembly has taken place can be used as a final substrate, and a method for manufacturing same. According to an embodiment of the present invention, first-conductive-type electrodes of vertical-type semiconductor light-emitting elements can be connected to seed metal, which is used as a wiring electrode, via a solder part, and thus there is the effect of directly using, as a final substrate, an assembly substrate (Continued)

on which the vertical-type semiconductor light-emitting elements are self-assembled, without an additional transfer process.

12 Claims, 15 Drawing Sheets

(52) U.S. Cl.
CPC .............. *H01L 24/29* (2013.01); *H01L 24/32* (2013.01); *H01L 33/007* (2013.01); *H01L 33/0093* (2020.05); *H01L 2224/29021* (2013.01); *H01L 2224/32237* (2013.01); *H01L 2224/83801* (2013.01); *H01L 2224/95101* (2013.01); *H01L 2224/95133* (2013.01); *H01L 2224/95136* (2013.01)

(56) References Cited

FOREIGN PATENT DOCUMENTS

| KR | 10-2019-0004136 | 1/2019 |
| KR | 10-2019-0085892 | 7/2019 |
| KR | 10-2019-0092330 | 8/2019 |
| KR | 10-2019-0096474 | 8/2019 |

OTHER PUBLICATIONS

PCT International Application No. PCT/KR2019/011276, International Search Report dated May 22, 2020, 4 pages.

\* cited by examiner

[FIG. 1]
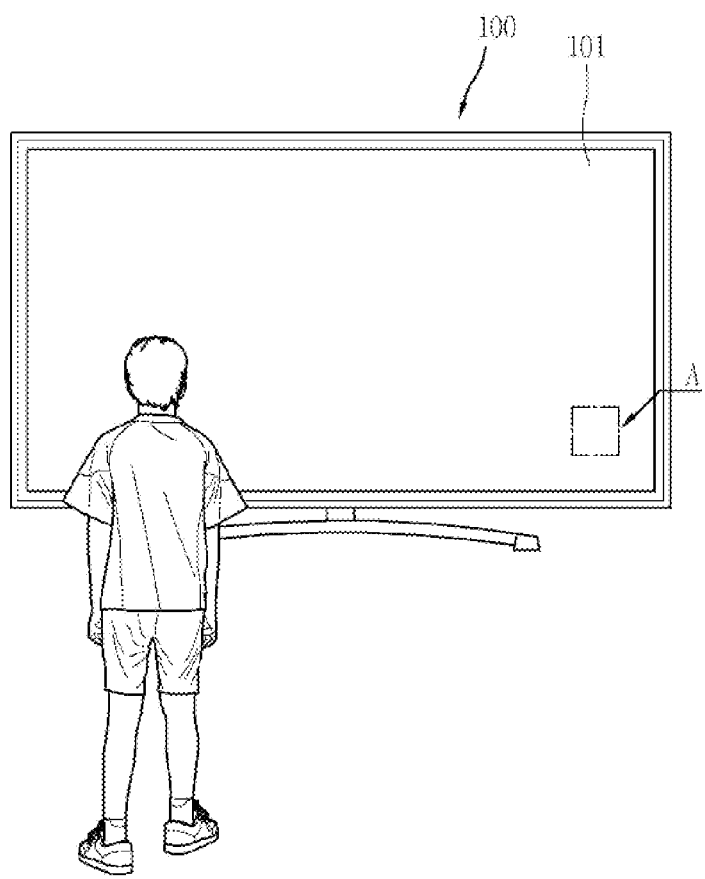

[FIG. 2]
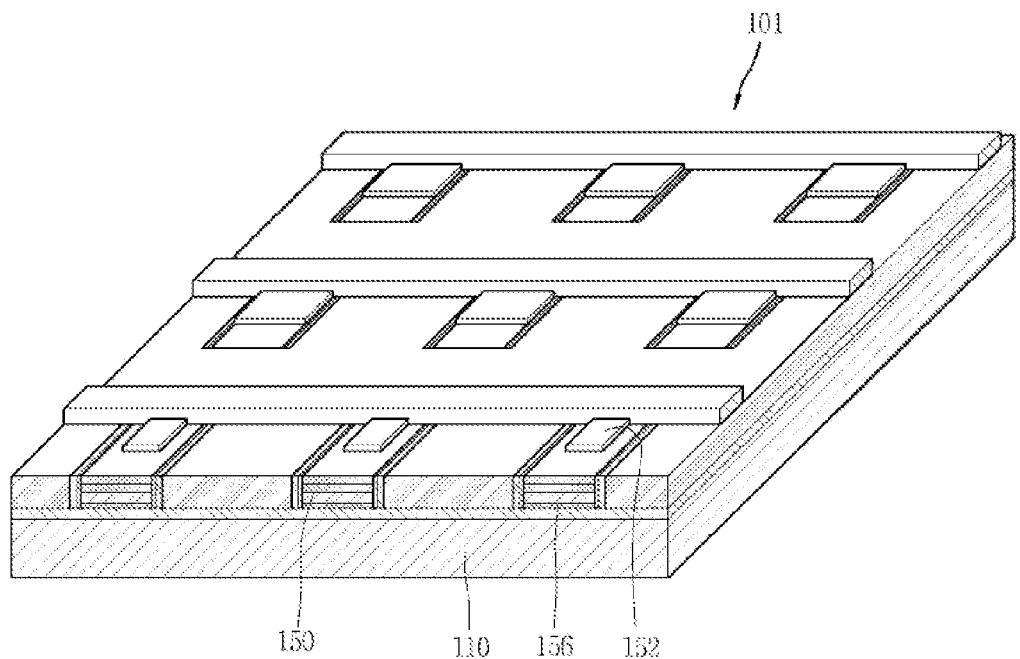
[FIG. 3]
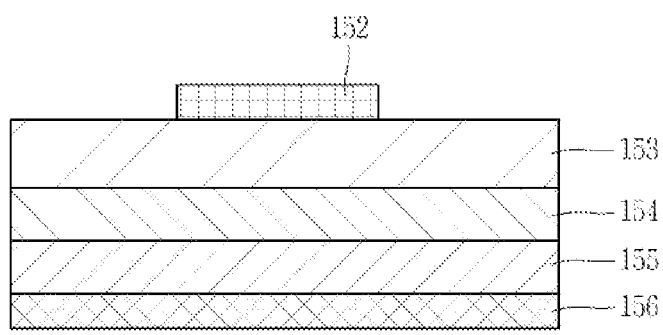

【FIG. 4】
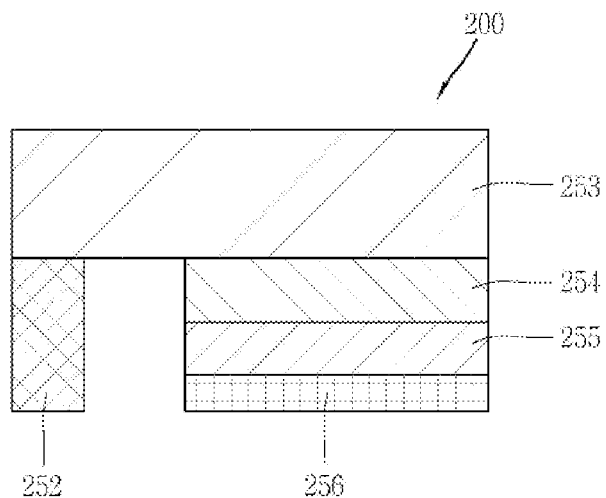
【FIG. 5a】
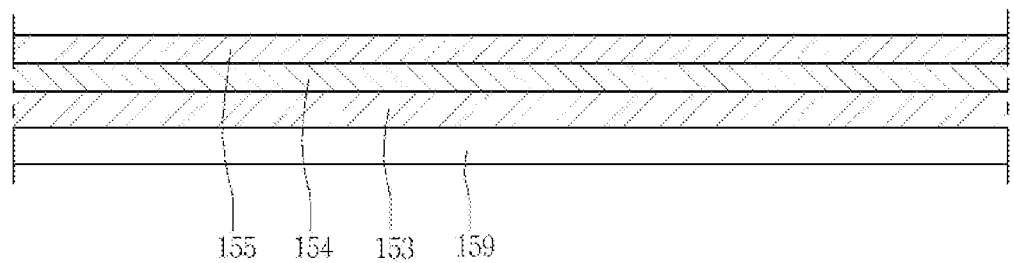
【FIG. 5b】
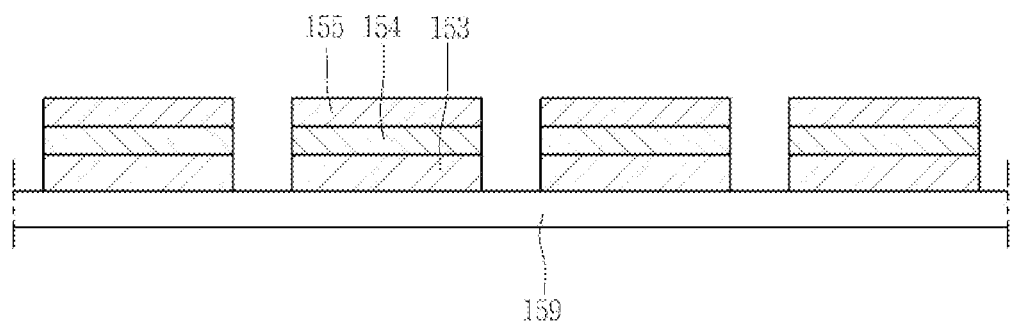

[FIG. 5c]
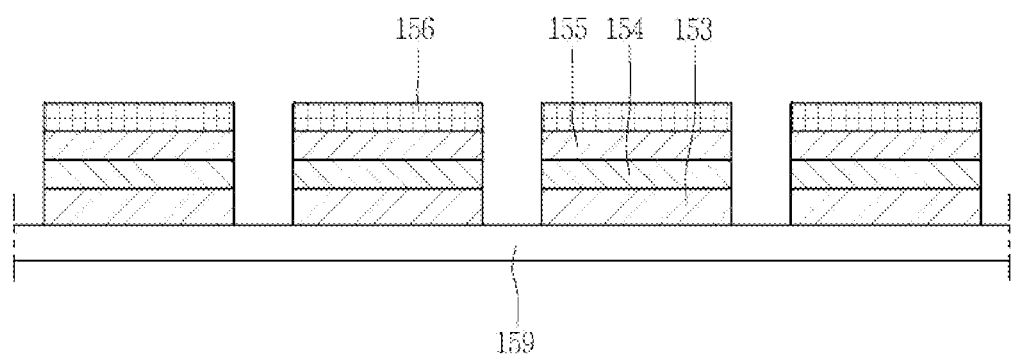
[FIG. 5d]
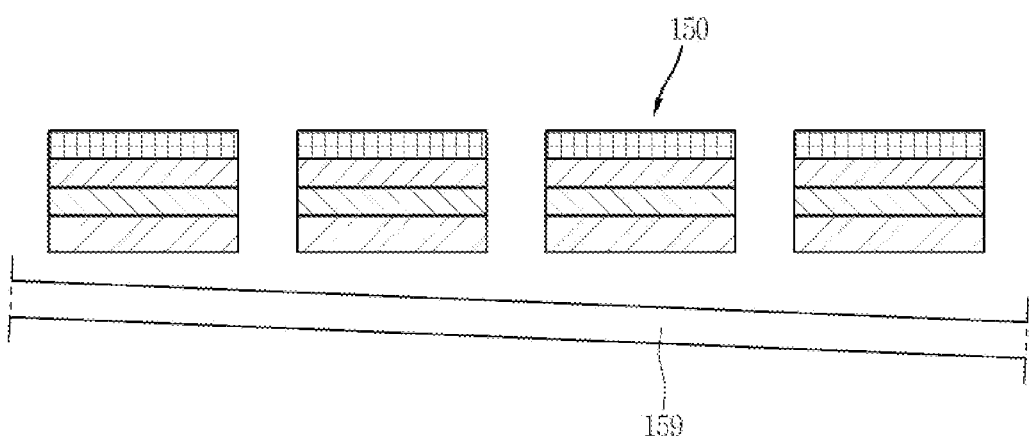

[FIG. 5e]
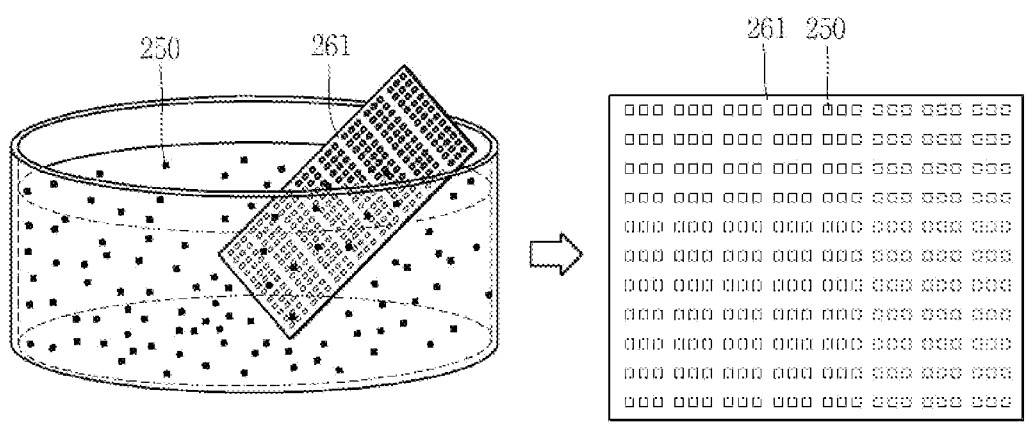

[FIG. 6]
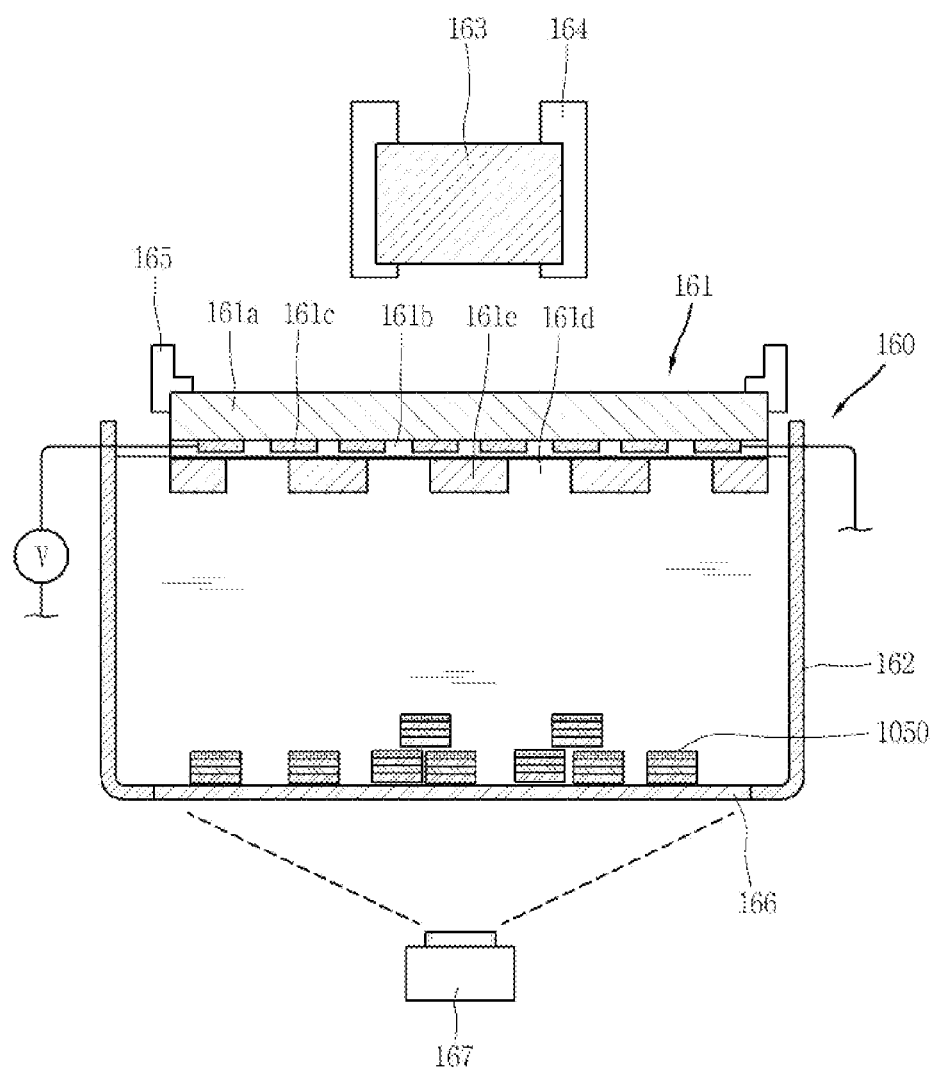

[FIG. 7]
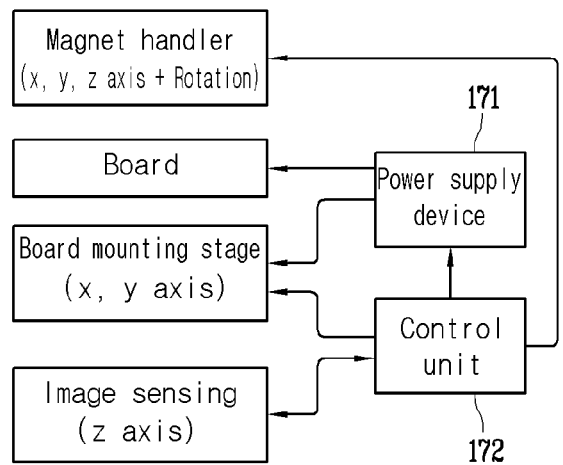
[FIG. 8a]
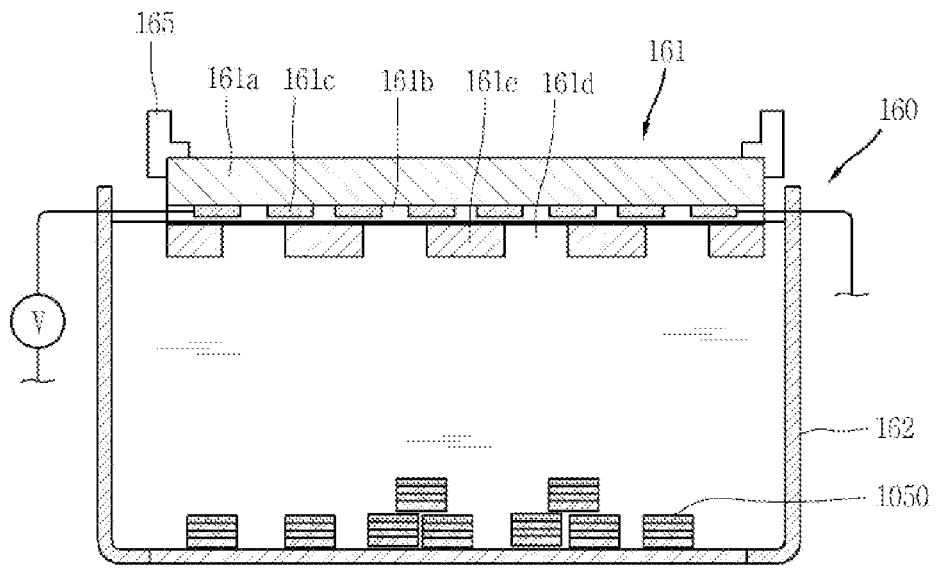

【FIG. 8b】
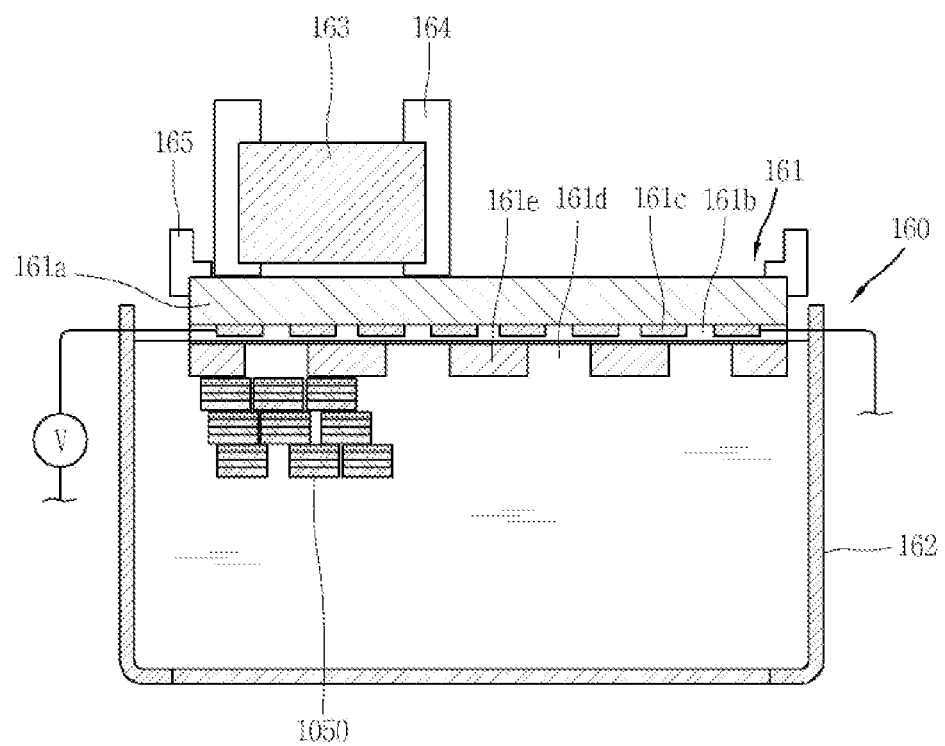

[FIG. 8c]
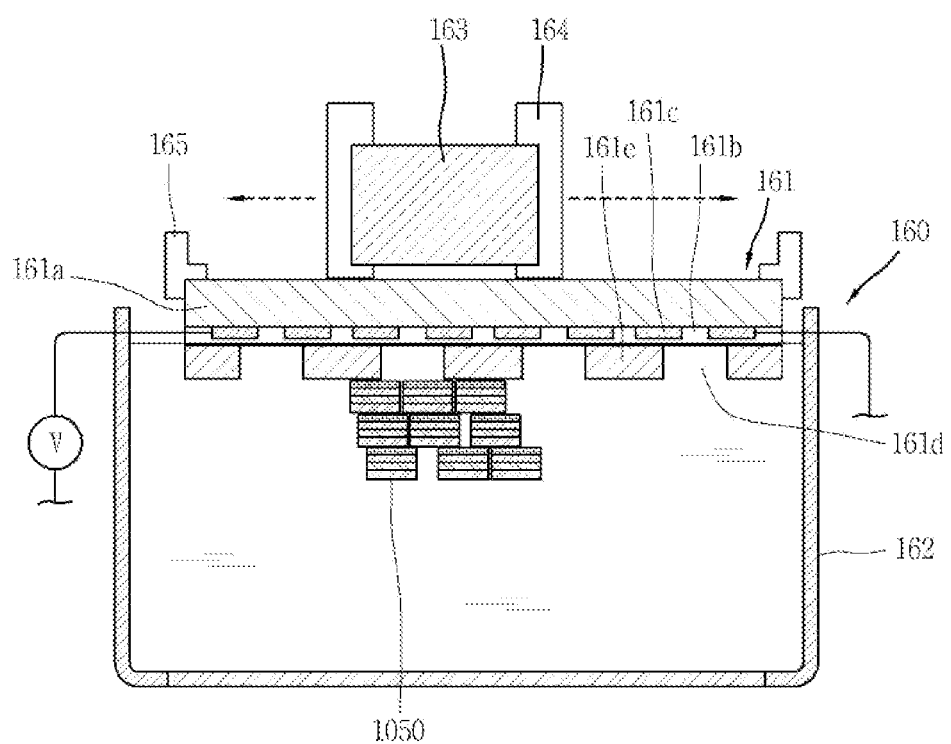

【FIG. 8d】
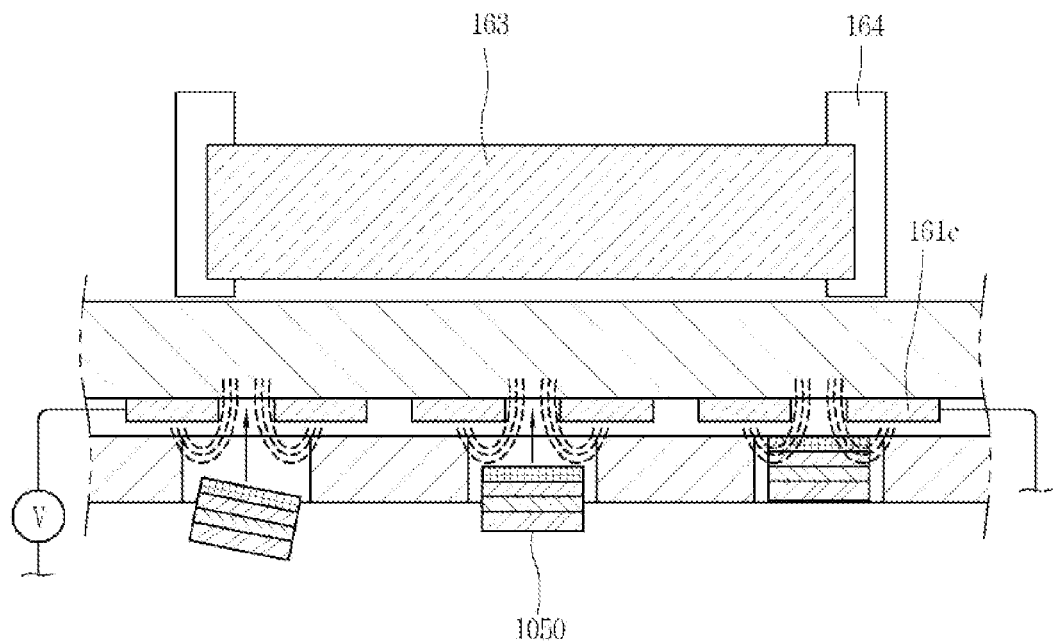
【FIG. 8e】
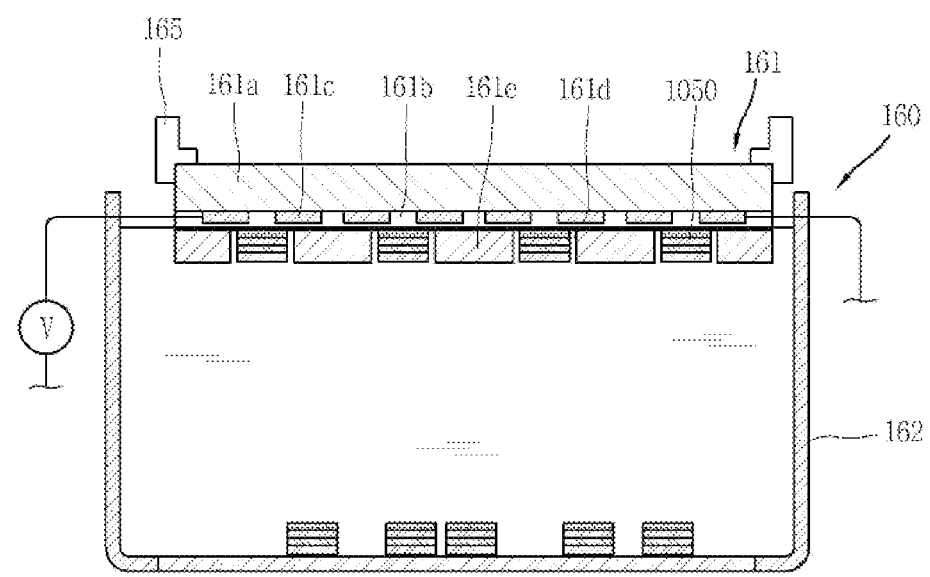

【FIG. 9】
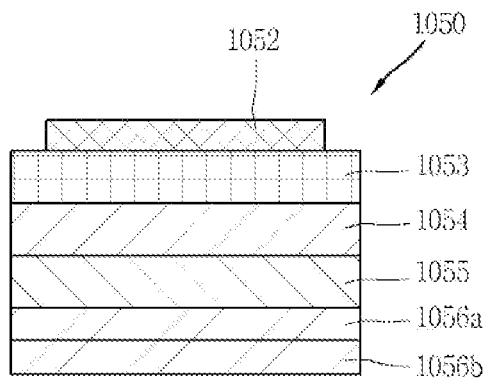
【FIG. 10】
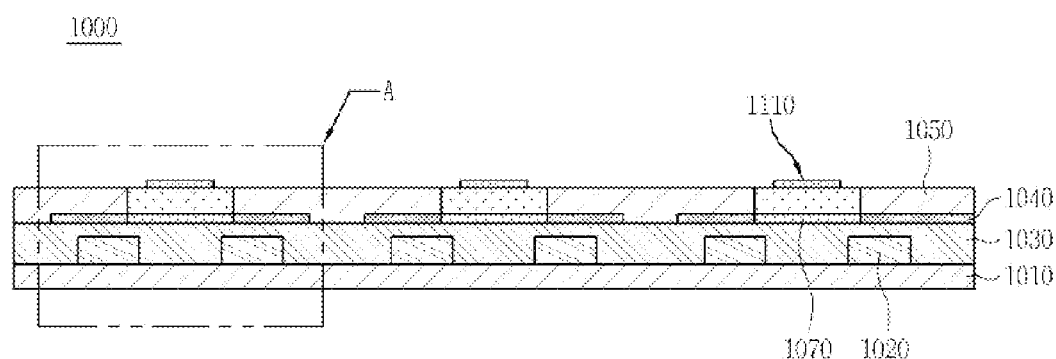
【FIG. 11】
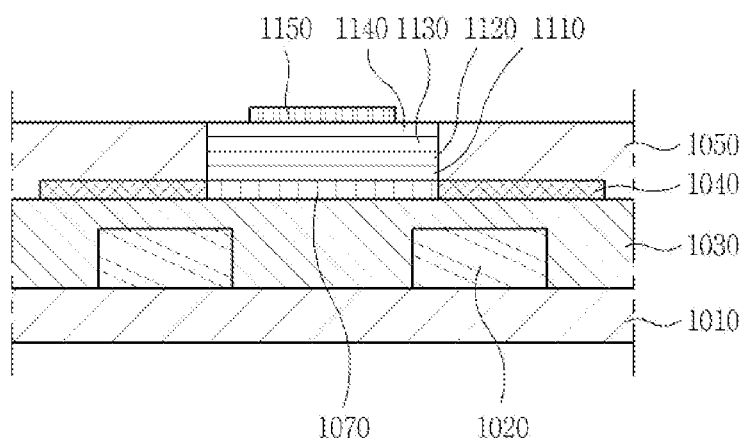

【FIG. 12】
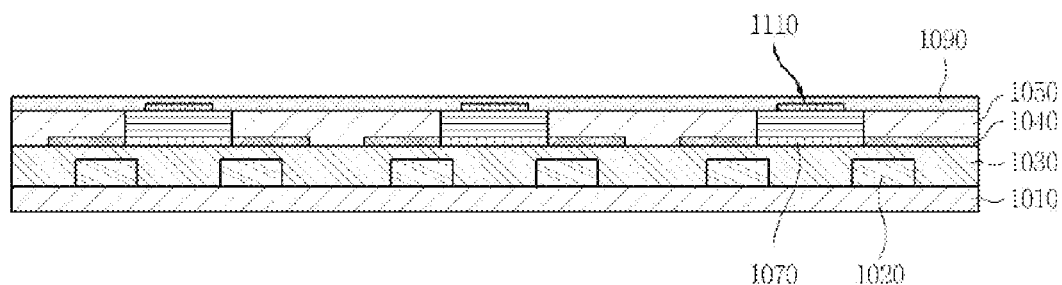
【FIG. 13】
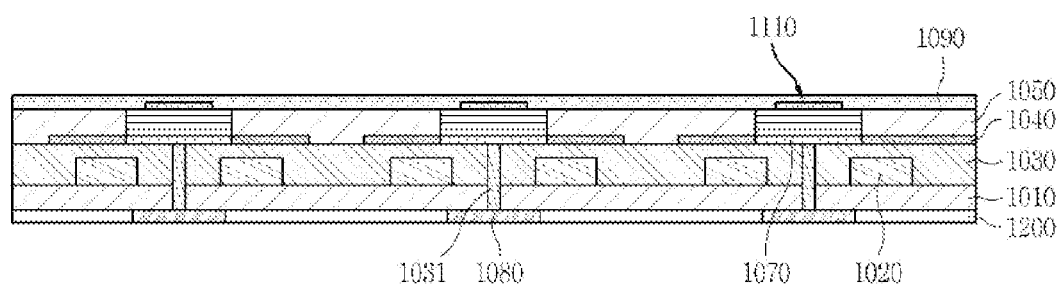
【FIG. 14a】
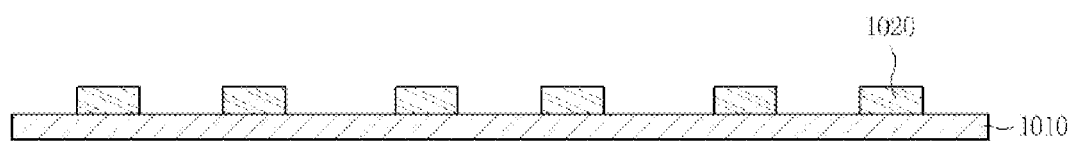
【FIG. 14b】
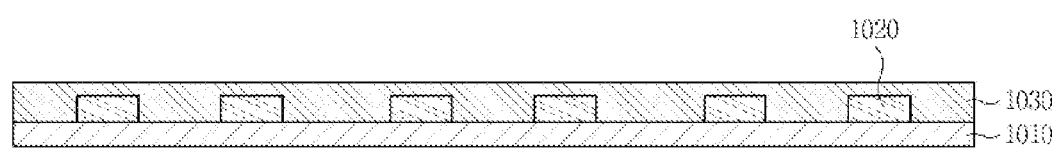

【FIG. 14c】
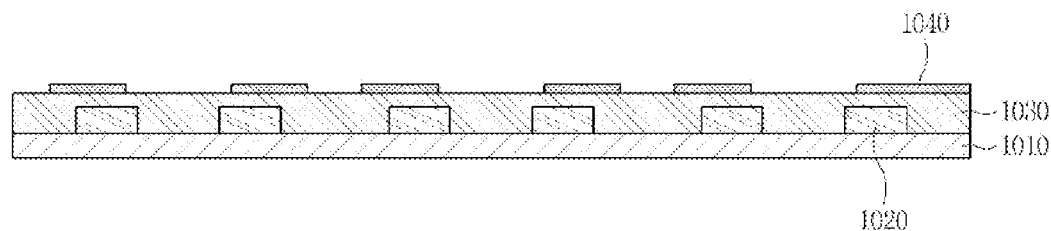
【FIG. 14d】
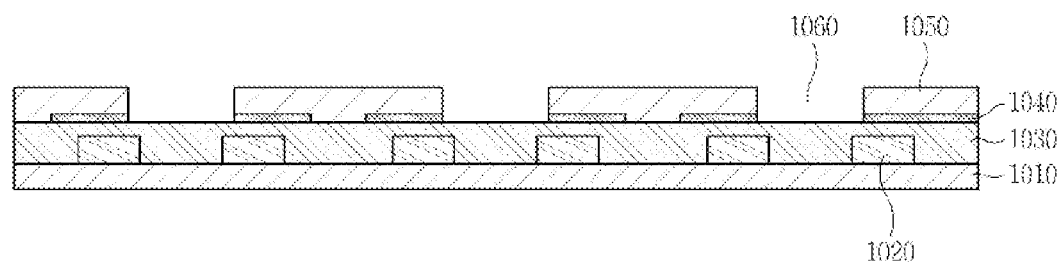
【FIG. 14e】
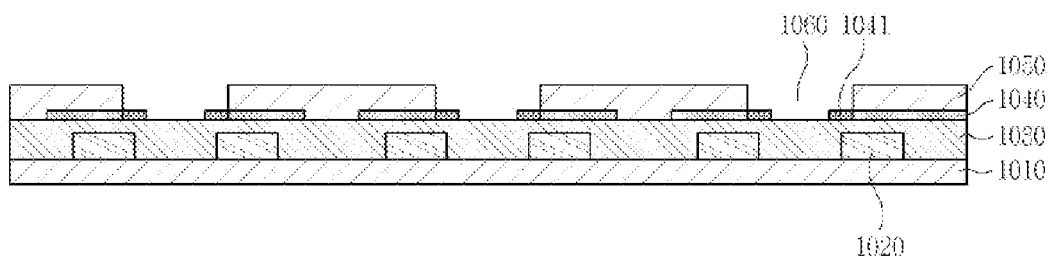
【FIG. 14f】
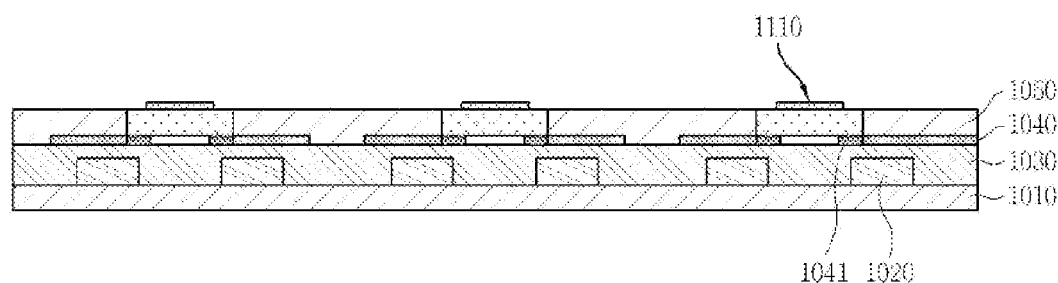

[FIG. 14g]
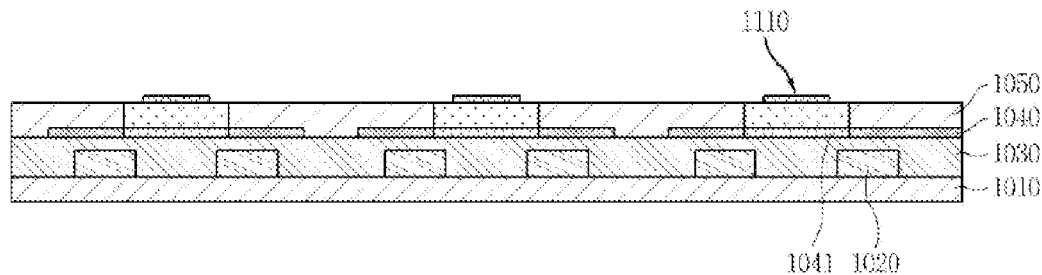
[FIG. 14h]
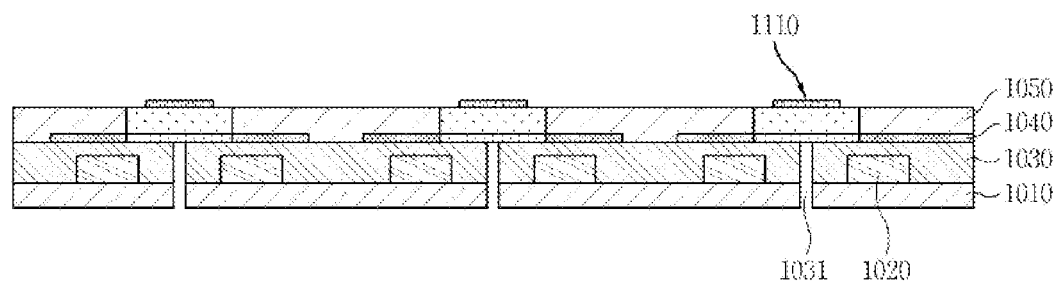
[FIG. 14i]
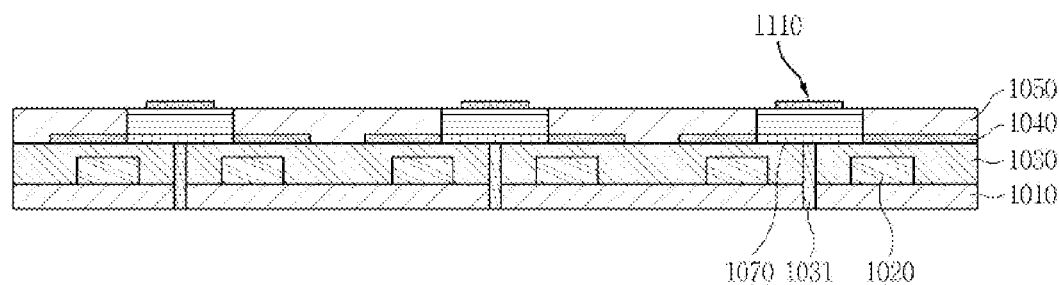

[FIG. 14j]
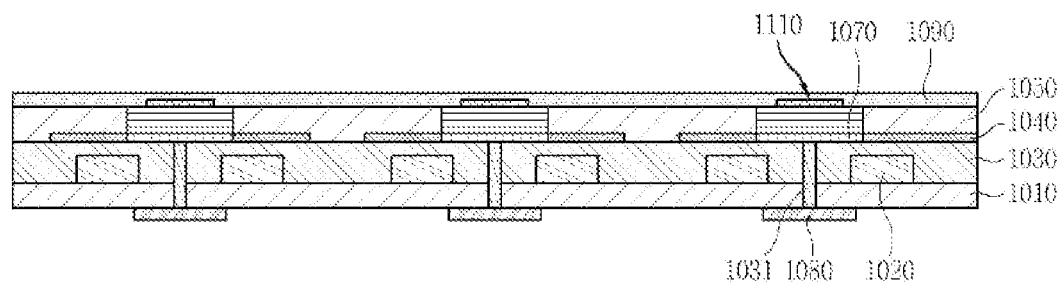
[FIG. 14k]
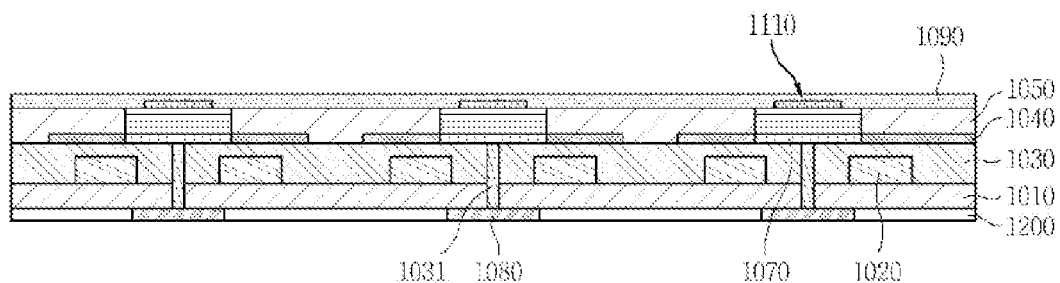

DISPLAY DEVICE USING SEMICONDUCTOR LIGHT-EMITTING ELEMENTS AND MANUFACTURING METHOD THEREFOR

CROSS-REFERENCE TO RELATED APPLICATIONS

This application is the National Stage filing under 35 U.S.C. 371 of International Application No. PCT/KR2019/011276, filed on Sep. 3, 2019, which claims the benefit of earlier filing date and right of priority to Korean Application No. 10-2019-0103773, filed on Aug. 23, 2019, the contents of which are all hereby incorporated by reference herein their entirety.

TECHNICAL FIELD

The present disclosure relates to a display device using semiconductor light emitting diodes and a method for manufacturing the same, and more particularly, to a display device using semiconductor light emitting diodes having a size of several to several tens of μm and a method for manufacturing the same.

BACKGROUND ART

Recently, liquid crystal displays (LCD), organic light emitting diode (OLED) displays, and micro LED displays are competing to implement large-area displays in the display technology field.

However, in the case of LCD, there are problems such as slow response time and low efficiency of light generated by backlights, in the case of OLED, there are problems such as short lifespans, poor mass production yields, and low efficiency.

On the other hand, when a semiconductor light emitting diode (micro LED) having a diameter or cross-sectional area of 100 μm or less is used for a display, very high efficiency can be achieved because the display does not absorb light using a polarizing plate or the like. However, since a large display requires millions of semiconductor light emitting diodes, it is difficult to transfer the diodes compared to other technologies.

The technologies currently being developed for a transfer process may comprise pick & place technology, Laser Lift-off (LLO) technology, self-assembly technology or the like. Among them, the self-assembly technology is a method in which a semiconductor light emitting diode finds its own position in a fluid, and is the most advantageous method for realizing a large-screen display device.

On the other hand, as the self-assembly method, there are a method of directly assembling a semiconductor light emitting diode to a final board to be used in the product, and a method of assembling a semiconductor light emitting diode on an assembly board and transferring the semiconductor light emitting diode to the final board through an additional transfer process. The method of directly assembling a semiconductor light emitting diode to a final board is efficient in terms of process, and the method of using the assembly board is advantageous in that structures for self-assembly can be added without limitation, so the two methods are selectively used.

DISCLOSURE

Technical Problem

An object of the present disclosure is to provide a display device in which a structure capable of utilizing an assembly board as a final board is implemented, and a method for manufacturing the same.

In particular, an object of the present disclosure is to provide a display device in which a structure capable of electrically connecting semiconductor light emitting diodes and the wiring electrode formed on the assembly board via a solder portion by forming a solder portion inside a cell in which the semiconductor light emitting diodes are assembled, even if a vertical semiconductor light emitting diodes in which the electrodes are arranged vertically is assembled, and a method for manufacturing the same.

Technical Solution

A display device according to an embodiment of the present disclosure comprises a base portion, assembly electrodes extending in one direction and to be formed at predetermined intervals on the base portion, a first dielectric layer stacked on the base portion to cover the assembly electrodes, seed metals extending in the same direction as the assembly electrodes and to be formed on the first dielectric layer, a barrier rib formed to cover at least a portion of the seed metals while forming cells on the first dielectric layer at predetermined intervals to overlap at least a portion of the assembly electrode in an extension direction of the seed metals, and semiconductor light emitting diodes seated in the cell formed by the barrier rib, in which a solder portion connected to the semiconductor light emitting diode seated in the cell and the seed metal exposed inside the cell is formed on at least a portion of a bottom surface of the cell.

In the present embodiment, the semiconductor light emitting diode comprises a first conductive electrode, a first conductive semiconductor layer formed on the first conductive electrode, an active layer formed on the first conductive semiconductor layer, a second conductive semiconductor layer formed on the active layer, and a second conductive electrode formed on the second conductive semiconductor layer, in which the solder portion is connected to the first conductive electrode of the semiconductor light emitting diode.

In the present embodiment, the display device further comprises a first electrode connecting the first conductive electrodes of the semiconductor light emitting diodes arranged in a first direction under the base portion, in which the first direction is a direction in which the seed electrodes extend.

In the present embodiment, the display device further comprises an electrode hole which is formed to pass through the first dielectric layer and the base portion, has one side in contact with the solder portion and an other side in contact with the first electrode, and in which a conductive material is filled.

In the present embodiment, the display device further comprises a second electrode extending in a second direction on the barrier rib and connecting the second conductive electrodes of the semiconductor light emitting diodes arranged in the second direction, in which the second direction is a direction crossing the first direction.

A method for manufacturing a display device according to an embodiment of the present disclosure comprises forming assembly electrodes extending in one direction on a base portion at predetermined intervals, forming a first dielectric layer on the base portion to cover the assembly electrodes, forming seed metals extending in the same direction as the assembly electrodes on the first dielectric layer, forming barrier ribs to cover at least a portion of the seed metals while forming cells on the first dielectric layer at predetermined intervals to overlap the assembly electrodes in an extension direction of the seed metals, forming a metal plating layer on one surface of the seed metals exposed inside the cell by applying a voltage to the seed metals, seating semiconductor light emitting diodes in the cell, and forming a solder portion connected to the semiconductor light emitting diode seated in the cell by melting the seed electrode and the metal plating layer through heat treatment.

In the present embodiment, the semiconductor light emitting diode comprises a first conductive electrode, a first conductive semiconductor layer formed on the first conductive electrode, an active layer formed on the first conductive semiconductor layer, a second conductive semiconductor layer formed on the active layer, and a second conductive electrode formed on the second conductive semiconductor layer, in which the solder portion is connected to the first conductive electrode of the semiconductor light emitting diode.

In the present embodiment, the forming the solder portion comprises an annealing process.

In the present embodiment, the method further comprises forming a first electrode connecting the first conductive electrodes of the semiconductor light emitting diodes arranged in a first direction under the base portion, in which the first direction is a direction in which the seed electrodes extend.

In the present embodiment, the method further comprises etching the base portion and the first dielectric layer to form an electrode hole passing through the base portion and the first dielectric layer, in which an electrode hole has one side connecting with the solder portion and an other side connecting with the first electrode, and in which a conductive material is filled.

In the present embodiment, the method further comprises forming a second electrode extending in a second direction on the barrier rib and connecting the second conductive electrodes of the semiconductor light emitting diodes arranged in the second direction, in which the second direction is a direction crossing the first direction.

In the present embodiment, the semiconductor light emitting diodes are seated in the cell using an electric field and a magnetic field after being put into a fluid.

Advantageous Effect

According to an embodiment of the present disclosure, there is an effect that the first conductive electrode of the vertical semiconductor light emitting diode and the seed metal used as the wiring electrode can be connected by a solder portion, so that the assembly board on which the vertical semiconductor light emitting diodes are self-assembled can be capable of directly being used as a final board without an additional transfer process.

DESCRIPTION OF DRAWINGS

FIG. 1 is a conceptual diagram illustrating an embodiment of a display device using a semiconductor light emitting diode of the present disclosure.

FIG. 2 is a partially enlarged view of portion A of the display device of FIG. 1.

FIG. 3 is an enlarged view of the semiconductor light emitting diode of FIG. 2.

FIG. 4 is an enlarged view illustrating another embodiment of the semiconductor light emitting diode of FIG. 2.

FIGS. 5a to 5e are conceptual views for describing anew process of manufacturing the semiconductor light emitting diode.

FIG. 6 is a conceptual diagram illustrating an example of a self-assembly apparatus of a semiconductor light emitting diode according to the present disclosure.

FIG. 7 is a block diagram of the self-assembly apparatus of FIG. 6.

FIGS. 8a to 8e are conceptual views illustrating a process of self-assembling a semiconductor light emitting diode using the self-assembly apparatus of FIG. 6.

FIG. 9 is a conceptual diagram for describing the semiconductor light emitting diode of FIGS. 8a to 8e.

FIG. 10 is a cross-sectional view illustrating a display device according to an embodiment of the present disclosure.

FIG. 11 is an enlarged view illustrating part A of FIG. 10.

FIG. 12 is a cross-sectional view illustrating a display device to which an upper wiring is added according to an embodiment of the present disclosure.

FIG. 13 is a cross-sectional view illustrating a display device to which lower wiring and electrode holes are added according to an embodiment of the present disclosure.

FIGS. 14a to 14k are diagrams sequentially, respectively, illustrating steps of a method of manufacturing a display device according to an embodiment of the present disclosure.

BEST MODE

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings. It is also understood that when an element, such as a layer, region, or substrate, it is referred to as being "on" another element, it may be directly present on the other element or intervening elements in between.

The display device described in this specification may comprise a mobile phone, a smart phone, a laptop computer, a digital broadcasting terminal, a personal digital assistant (PDA), a portable multimedia player (PMP), a navigation system, and a slate PC, a tablet PC, an ultra book, a digital TV, a desktop computer and the like.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may comprise a panel 141 on which images are displayed, and the panel 141 may comprise a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights comprising blue.

The vertical semiconductor light emitting diode may comprise a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in a upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may comprise a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on the board of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

First, according to the manufacturing method, a first conductive semiconductor layer 153, an active layer 154, and a second conductive semiconductor layer 155 are individually grown on a growth substrate 159 (FIG. 5a).

After the first conductive semiconductor layer 153 is grown, the active layer 154 is grown on the first conductive semiconductor layer 153, and then the second conductive semiconductor layer 155 is grown on the active layer 154. In this way, when the first conductive semiconductor layer 153, the active layer 154, and the second conductive semiconductor layer 155 are sequentially grown, as shown in FIG. 5a, the first conductive semiconductor layer 153, the active layer 154 and the second conductive semiconductor layer 155 form a stacked structure.

In this case, the first conductive semiconductor layer 153 may be a p-type semiconductor layer, and the second conductive semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 1059 may be formed of a material suitable for semiconductor material growth, a carrier wafer. The growth substrate 159 may be formed of a material having excellent thermal conductivity, and may comprise a conductive board or an insulating board, for example, a SiC board having higher thermal conductivity than a sapphire (Al2O3) board, or use at least one of Si, GaAs, GaP, InP, and Ga2O3.

Next, at least a portion of the first conductive semiconductor layer 153, the active layer 154, and the second conductive semiconductor layer 155 are removed to form a plurality of semiconductor light emitting diodes (FIG. 5*b*).

More specifically, isolation is performed such that the plurality of light emitting diodes form a light emitting diode array. That is, the first conductive semiconductor layer 153, the active layer 154, and the second conductive semiconductor layer 155 are vertically etched to form a plurality of semiconductor light emitting diodes.

In the case of forming a horizontal type semiconductor light emitting diode, a mesa process in which the active layer 154 and the second conductive semiconductor layer 155 are partially removed in the vertical direction and the first conductive semiconductor layer 153 is exposed to the outside and thereafter, isolation in which the first conductive semiconductor layer is etched to form a plurality of semiconductor light emitting diode arrays may be performed.

Next, second conductive electrodes 156 (or p-type electrodes) are formed on one surface of the second conductive semiconductor layer 155 (FIG. 5*c*). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductive electrode 156 may be an n-type electrode.

Then, the growth substrate 159 is removed to provide a plurality of semiconductor light emitting diodes. For example, the growth substrate 1059 may be removed using a laser lift-off (LLO) method or a chemical lift-off (CLO) method (FIG. 5*d*).

Thereafter, the semiconductor light emitting diodes 150 are seated on a board in a chamber filled with a fluid (FIG. 5*e*).

For example, the semiconductor light emitting diodes 150 and the board are put in the chamber filled with a fluid, and the semiconductor light emitting diodes are self-assembled onto the board 1061 using flow, gravity, surface tension, and the like. In this case, the board may be an assembly board 161.

As another example, it is also possible to put the wiring board in a fluid chamber instead of the assembly board 161 so that the semiconductor light emitting diodes 150 are directly seated on the wiring board. In this case, the board may be the wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8*a* to 8*d* are conceptual views illustrating a process of self-assembling a semiconductor light emitting diode using the self-assembly apparatus of FIG. 6, and FIG. 9 is a conceptual diagram for describing the semiconductor light emitting diode of FIGS. 8*a* to 8*d*.

Referring to FIGS. 6 and 7, a self-assembly apparatus 160 of the present disclosure may comprise a fluid chamber 162, a magnet 163 and a position control unit 164.

The fluid chamber 162 has a space for accommodating a plurality of semiconductor light emitting diodes. The space may be filled with a fluid, and the fluid may comprise water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may comprise a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may comprise a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure comprises a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may comprise a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may comprise a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may comprise a magnetic material to move in the fluid due to the magnetic field of the magnet 163.

Referring to FIG. 9, a semiconductor light emitting diode comprising a magnetic material may comprise a first conductive electrode 1052, a second conductive electrode 1056, a first conductive semiconductor layer 1053 on which the first conductive electrode 1052 is disposed, a second conductive semiconductor layer 1055 on which the second conductive electrode 1056 is disposed, the second conductive semiconductor layer 1055 overlapping the first conductive semiconductor layer 1052 and an active layer 1054 disposed between the first and second conductive semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductive electrode 1052 may be generated after the semiconductor light emitting diode is assembled to the wiring board through self-assembly of the semiconductor light emitting diode. Also, in the present disclosure, the second conductive electrode 1056 may comprise the magnetic material. The magnetic material may mean a magnetic metal. The magnetic material may be Ni, SmCo, or the like, and as another example, may comprise a material corresponding to at least one of Gd-based, La-based, and Mn-based materials.

The magnetic material may be provided in the second conductive electrode 1056 in the form of particles. Alternatively, the conductive electrode comprising a magnetic material may have one layer formed of a magnetic material. For this example, as shown in FIG. 9, the second conductive electrode 1056 of the semiconductor light emitting diode 1050 may comprise a first layer 1056a and a second layer 1056b. Here, the first layer 1056a may comprise a magnetic material, and the second layer 1056b may comprise a metal material rather than a magnetic material.

As shown, in this example, the first layer 1056a comprising a magnetic material may be disposed to contact the second conductive semiconductor layer 1055. In this case, the first layer 1056a is disposed between the second layer 1056b and the second conductive semiconductor layer 1055. The second layer 1056b may be a contact metal connected to the second electrode of the wiring board. However, the present disclosure is not necessarily limited thereto, and the magnetic material may be disposed on one surface of the first conductive semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may comprise an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 comprising a magnetic material are formed through the process described with reference to FIGS. 5a to 5c. In this case, in the process of forming the second conductive electrode of FIG. 5c, a magnetic material may be deposited on the semiconductor light emitting diode.

Next, the board 161 is transferred to an assembly position, and the semiconductor light emitting diodes 1050 are put into the fluid chamber 162 (FIG. 8a).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Next, a magnetic force is applied to the semiconductor light emitting diodes 1050 such that the semiconductor light emitting diodes 1050 vertically float in the fluid chamber 162 (FIG. 8b).

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8c). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8c). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8d). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area board. Through this, it is possible to manufacture a large-area display device at a low cost.

On the other hand, in a case where the board on which the semiconductor light emitting diodes are assembled is used as the final board, the transfer step during the post process of self-assembly can be omitted, and the wiring process for electrically connecting the electrodes of the board and the electrodes of the semiconductor light emitting diode can be performed. That is, in order to directly use the assembly board as a final board, wiring work (work forming an electrode for wiring on the board or connecting a pre-formed electrode and an electrode of the semiconductor light emitting diode) has to be possible in a state where the semiconductor light emitting diodes are assembled.

At this time, in the case of a flip-chip type semiconductor light emitting diode in which the electrodes are arranged in the same direction as illustrated in FIG. 4, it is possible to perform the wiring work after assembling the semiconductor light emitting diodes and then forming the electrodes on the upper part of the board, but in the case of a vertical semiconductor light emitting diode in which electrodes are arranged vertically as illustrated in FIG. 3, in order to connect the electrode of the semiconductor light emitting diode assembled toward the bottom of the board to the electrode of the board, a process of transferring the semiconductor light emitting diodes to another board is required, and in this process, problems such as cost incurred due to the addition of processes, problems with yield reduction due to separation of semiconductor light emitting diodes, and the like occur.

The present disclosure relates to a display device having a structure in which an assembly board can be used as a final board even when self-assembly of a vertical semiconductor light emitting diode in which electrodes are arranged vertically and, hereinafter, embodiments of the present disclosure will be described in detail with reference to the accompanying drawings.

FIG. 10 is a cross-sectional view illustrating a display device according to an embodiment of the present disclosure, FIG. 11 is an enlarged view illustrating part A of FIG. 10, FIG. 12 is a cross-sectional view illustrating a display device to which an upper wiring is added according to an embodiment of the present disclosure, and FIG. 13 is a cross-sectional view illustrating a display device to which lower wiring and electrode holes are added according to an embodiment of the present disclosure.

In the display apparatus 1000 according to an embodiment of the present disclosure, assembly electrodes 1020 for forming an electric field may be formed on the base portion 1010 when self-assembly is performed.

The base portion 1010 may be formed of an insulating material, and the assembly electrodes 1020 may extend in one direction and may be formed on the base portion 1010 at predetermined intervals. For example, the assembly electrodes 1020 may be patterned on the base portion 1010. The adjacent assembly electrodes 1020 form pair electrodes, and voltages of different polarities may be applied to the pair electrodes to form an electric field between the pair electrodes.

A first dielectric layer 1030 covering the assembly electrodes 1020 may be formed on the base portion 1010. The first dielectric layer 1030 may be formed of an inorganic material such as $SiO_2$, $SiN_x$, $Al_2O_3$, $TiO_2$, $HfO_2$, or the like.

Seed metals 1040 may be formed on the first dielectric layer 1030. The seed metals 1040 may extend in the same direction as the assembly electrodes 1020 and may be formed on the first dielectric layer 1030 at predetermined intervals.

The seed metals 1040 may be formed to have a thickness of several tens to several hundreds of nm and an interval between the seed metals 1040 may be the same as or narrower than the width of the cell 1060 formed by the barrier rib 1050, which will be described later.

In addition, a barrier rib 1050 covering at least a portion of the seed metals 1040 may be formed on the first dielectric layer 1030 while forming the cell 1060 in the extension direction of the seed metals 1040. For example, the barrier rib 1050 may be formed to cover the entire top surface or a part of the top surface of the seed metals 1040, so that at least side surfaces of the seed metals 1040 may be exposed inside the cell 1060.

Meanwhile, the cell 1060 is a region in which semiconductor light emitting diodes 1100 to be described later are seated and may be formed to overlap with assembly electrodes 1020, specifically, a portion of pair electrodes forming an electric field.

According to an embodiment of the present disclosure, the vertical semiconductor light emitting diode 1100 according to FIG. 9 may be seated in the cell 1060. The vertical semiconductor light emitting diode 1100 may comprise a first conductive electrode 1110, a first conductive semiconductor layer 1120 formed on the first conductive electrode 1110, an active layer 1130 formed on the first conductive semiconductor layer 1120, a second conductive semiconductor layer 1140 formed on the active layer 1130, and a second conductive electrode 1150 formed on the second conductive semiconductor layer 1140. In addition, the first conductive electrode 1110 layer may comprise a magnetic material for self-assembly.

In addition, according to an embodiment of the present disclosure, on at least a portion of the bottom surface of the cell 1060, a solder portion 1070 connected to the above-described semiconductor light emitting diode 1110 and the seed metal 1040 exposed inside the cell 1060 may be formed.

Specifically, the solder portion 1070 may be connected to the first conductive electrode 1110 of the semiconductor light emitting diode 1100 and the seed metal 1040 exposed inside the cell 1060. In more detail, the solder portion 1070 may be formed of a metal material to electrically connect the first conductive electrode 1110 of the semiconductor light emitting diode 1100 and the seed metal 1040 exposed inside the cell 1060. That is, according to the present disclosure, the seed metals 1040 may serve as wiring electrodes.

Meanwhile, according to another embodiment of the present disclosure, a first electrode 1080 connected to the semiconductor light emitting diodes 1100 seated in the cell 1060 may be further included by supplementing the thin seed metals 1040.

The first electrode 1080 may connect the first conductive electrodes 1110 of the semiconductor light emitting diodes 1100 arranged in the first direction under the base portion 1010. Here, the first direction may be a direction in which the seed electrodes 1040 extend.

According to an embodiment of the present disclosure, in a case where the first electrode 1080 is formed, an electrode hole 1031 for connecting the semiconductor light emitting diode 1100 and the first electrode 1080 may be further included. The electrode hole 1031 may be formed to pass through the first dielectric layer 1030 and the base portion 1010, and the inside thereof may be filled with a conductive material. One side of the electrode hole 1031 may be in contact with the solder portion 1070 formed on the bottom surface of the cell 1060, and the other side thereof may be in contact with the first electrode 1080, whereby the semiconductor light emitting diode 1110 and the first electrode 1080 may be connected.

In addition, a second dielectric layer 1200 covering the first electrodes 1080 may be formed under the base portion 1010 on which the first electrode 1080 is formed, and the lower portion of the base portion 1010 can be flattened by the second dielectric layer 1200.

Meanwhile, the second conductive electrodes 1150 of the semiconductor light emitting diode 1100 arranged in the second direction may be connected by the second electrode 1090. The second electrode 1090 may be formed to extend in the second direction on the barrier rib 1050, and in this case, the second direction may be a direction crossing the above-described first direction.

For example, the semiconductor light emitting diode 1110 may be arranged in a matrix form consisting of a plurality of columns and rows, and the first direction may mean a row direction, and the second direction may mean a column direction crossing the row direction. Alternatively, the first direction may mean a column direction, and the second direction may mean a row direction.

Hereinafter, a method of manufacturing the display apparatus 1000 according to an embodiment of the present disclosure will be described.

FIGS. 14a to 14k are diagrams sequentially, respectively, illustrating steps of a method of manufacturing a display device according to an embodiment of the present disclosure.

First, the step of forming the assembly electrodes 1020 extending in one direction on the base portion 1010 at predetermined intervals may be performed. For example, the assembly electrodes 1020 may be patterned on the base portion 1010 by a photolithography process.

Thereafter, a step of forming the first dielectric layer 1030 on the base portion 1010 to cover the assembly electrodes 1020 may be performed. The first dielectric layer 1030 may be formed of an insulating and dielectric inorganic material (for example, $SiO_2$, $SiN_x$, or the like).

Next, a step of forming the seed metals 1040 extending in the same direction as the assembly electrodes 1020 on the first dielectric layer 1030 at predetermined intervals may be performed. The seed metals 1040 may be formed to a thickness of tens to hundreds of nm by deposition.

Next, a step of stacking the barrier rib 1050 on the first dielectric layer 1030 to cover at least a portion of the seed metals 1040 may be performed. The barrier rib 1050 may be formed of an inorganic material (for example, $SiO_2$, $SiN_x$, or the like) or an organic material (for example, a photosensitive polymer) and may be formed to a thickness of several to several tens of μm.

In addition, the barrier rib 1050 may form cells 1060 at predetermined intervals in the extension direction of the seed metals 1040, and the cells 1060 may overlap the assembly electrodes 1020. In this case, a portion of the seed metal 1040 may be exposed inside the cell 1060.

Next, a step of forming the metal plating layer 1041 on one surface of the seed metals 1040 may be performed. The metal plating layer 1041 may be formed by performing electroplating by applying a voltage to the seed metals 1040 and may be formed along the circumference of the cell 1060 as a whole by being formed on a surface of the seed metal 1040 exposed to the inside of the cell 1060, that is, the side of the seed metal 1040 or a portion of the side and top surface of the seed metal 1040.

However, in order to prevent the electric field formed by the assembly electrode 1020 from being shielded by the metal plating layer 1041, the metal plating layer 1041 may not be formed on at least a part of the bottom surface of the cell 1060, preferably may not be formed in the center of the bottom surface of the cell 1060.

Meanwhile, the material forming the seed metal 1040 may be formed of a material having a lower reactivity than the material forming the metal plating layer 1041 and may be selected and used according to the corresponding condition among the metals forming the electrode, for example, Ti, Al, Ag, Au, Pd, Ni, Cu, or the like.

Next, a step of seating the semiconductor light emitting diodes 1100 in the cell 1060 by applying a voltage to the assembly electrodes 1020 may be performed. Here, the semiconductor light emitting diodes 1100 may be seated in the cell 1060 by a self-assembly method using an electric field and a magnetic field after being put into the fluid.

In addition, the semiconductor light emitting diodes 1100 used for self-assembly may be vertical type semiconductor light emitting diodes 1100, and details related thereto will be omitted.

Next, a step of forming the solder portion 1070 connecting the seed electrode 1040 and the semiconductor light emitting diodes 1100 seated in the cell 1060 through heat treatment may be performed. Specifically, the solder portion 1070 may be formed by melting the seed electrode 1040 and the metal plating layer 1041 during heat treatment and may be formed to fill the bottom surface of the cell 1060.

Meanwhile, the heat treatment for forming the solder portion 1070 may comprise an annealing process.

As described above, the seed metal 1040 connected to the semiconductor light emitting diode 1100 by the solder portion 1070 may serve as a wiring electrode.

However, since a sufficient amount of current may not be secured due to the thin thickness of the seed metal 1040, or the like, the first electrode 1080 may be selectively included as an additional lower wiring to compensate for this, and in this case, the following steps may be further included.

Specifically, the method may further comprise a step of forming the first electrode 1080 extending in the first direction under the base portion 1010. Since the first electrode 1080 is formed to extend in the first direction, the first conductive electrodes 1110 of the semiconductor light emitting diodes 1100 arranged in the first direction may be connected to each other. Here, the first direction may be the same as a direction in which the seed metals 1040 extend.

After the first electrode 1080 is formed, a second dielectric layer 1200 may be formed to cover the first electrode 1080 and planarize the lower portion of the base portion 1010.

In this case, before forming the first electrode 1080, a step of forming an electrode hole 1031 for connecting the first electrode 1080 and the semiconductor light emitting diodes 1100 may be performed.

The electrode hole 1031 may be formed by etching the base portion 1010 and the first dielectric layer 1030 and then filling the inside thereof with a conductive material. One side of the electrode hole 1031 may be connected to the solder portion 1070 formed on the bottom surface of the cell 1060, and the other side thereof may be connected to the first electrode 1080 formed under the base portion 1010.

Meanwhile, the step of forming the second electrode 1090 connected to the second conductive electrode 1150 of the semiconductor light emitting diode 1100 may also be performed. The second electrode 1090 may be formed on the barrier rib 1050, extend in the second direction, and connect the second conductive electrodes 1150 of the semiconductor light emitting diodes 1100 arranged in the second direction. In this case, the second direction may mean a direction crossing the first direction.

Also, although not illustrated in the drawings, a layer made of an insulating material may be additionally formed on the second electrode 1090, and a black insulator may be included to improve contrast.

In addition, on the semiconductor light emitting diode 1100, a phosphor layer for realizing a sub-pixel is formed or a functional layer such as a light-transmitting layer may be selectively formed. In the case of the phosphor layer, the assembled semiconductor light emitting diodes 1100 may be formed only in a single color, for example, a blue semiconductor light emitting diode.

As described above, according to the embodiment of the present disclosure, the first conductive electrode 1110 of the vertical semiconductor light emitting diode 1100 and the seed metal 1040 used as a wiring electrode may be connected by the solder portion 1070, and thus there is an effect that the assembly board on which the vertical semiconductor light emitting diodes 1110 are self-assembled can be directly used as a final board without an additional transfer process.

The above-described present disclosure is not limited to the configuration and method of the above-described embodiments, but the embodiments may be configured by selectively combining all or part of each embodiment such that various modifications can be made.

What is claimed is:

1. A display device comprising:
    a base portion;
    a plurality of assembly electrodes extending along a first direction and formed at predetermined intervals on the base portion;
    a first dielectric layer disposed on the base portion to cover the assembly electrodes;
    a plurality of seed metals formed on the first dielectric layer and extending along the first direction;
    a plurality of barrier ribs formed to cover at least a portion of a top of each of the plurality of seed metals, wherein a plurality of cells are formed on the first dielectric layer at predetermined intervals between the plurality of barrier ribs and wherein each cell overlaps at least a portion of a corresponding assembly electrode of the plurality of assembly electrodes;
    a plurality of semiconductor light emitting diodes correspondingly positioned in the plurality of cells; and
    a plurality of solder portions each positioned at at least a portion of a bottom surface of a corresponding cell to connect a corresponding semiconductor light emitting diode to a corresponding seed metal.

2. The display device of claim 1, wherein each semiconductor light emitting diode comprises:
    a first conductive electrode;
    a first conductive semiconductor layer formed on the first conductive electrode;
    an active layer formed on the first conductive semiconductor layer;
    a second conductive semiconductor layer formed on the active layer; and
    a second conductive electrode formed on the second conductive semiconductor layer,
    wherein a corresponding solder portion is connected to the first conductive electrode.

3. The display device of claim 1, further comprising a plurality of first electrodes each configured to connect first conductive electrodes of a corresponding subset of semiconductor light emitting diodes arranged along the first direction.

4. The display device of claim 3, further comprising a plurality of electrode holes formed to pass through the first dielectric layer and the base portion, wherein each electrode hole is configured to allow a conductive material to pass therethrough to connect a corresponding solder portion and a corresponding first electrode.

5. The display device of claim 1, further comprising a plurality of second electrodes each extending along a second direction perpendicular to the first direction and configured to connect second conductive electrodes of a corresponding subset of the semiconductor light emitting diodes arranged along the second direction.

6. A method for manufacturing a display device, the method comprising:
    forming a plurality assembly electrodes extending along a first direction and formed at predetermined intervals on a base portion;
    forming a first dielectric layer on the base portion to cover the assembly electrodes;
    forming a plurality of seed metals on the first dielectric layer each extending along the first direction;
    forming a plurality of barrier ribs to cover at least a portion of a top of each of the plurality of seed metals, wherein a plurality of cells are formed on the first dielectric layer at predetermined intervals between the plurality of barrier ribs and wherein each cell overlaps at least a portion of a corresponding assembly electrode of the plurality of assembly electrodes;
    forming a metal plating layer on an exposed surface of each of the plurality of seed metals by applying a voltage to each of the plurality of seed metals;
    seating a semiconductor light emitting diode in each of the plurality of cells; and
    forming a solder portion to connect the semiconductor light emitting diode by heating the corresponding seed metal and metal plating layer.

7. The method of claim 6, wherein each semiconductor light emitting diode comprises:
    a first conductive electrode;
    a first conductive semiconductor layer formed on the first conductive electrode;
    an active layer formed on the first conductive semiconductor layer;
    a second conductive semiconductor layer formed on the active layer; and
    a second conductive electrode formed on the second conductive semiconductor layer,
    wherein a corresponding solder portion is connected to the first conductive electrode.

8. The method of claim 6, wherein forming the solder portion comprises an annealing process.

9. The method of claim 6, further comprising:
    forming a plurality of first electrodes each configured to connect first conductive electrodes of a corresponding subset of semiconductor light emitting diodes arranged along the first direction.

10. The method of claim 9, further comprising:
    forming a plurality of electrode holes through the first dielectric layer and the base portion, wherein each electrode hole is configured to allow a conductive material to pass therethrough to connect a corresponding solder portion and a corresponding first electrode.

11. The method of claim 6, further comprising:
    forming a plurality of second electrodes each extending along a second direction perpendicular to the first direction and configured to connect second conductive electrodes of a corresponding subset of the semiconductor light emitting diodes arranged along the second direction.

12. The method of claim 6, wherein seating the semiconductor light emitting diodes comprises applying an electric field and a magnetic field to the semiconductor light emitting diodes disposed in a fluid.

* * * * *